(12) United States Patent
Shiao et al.

(10) Patent No.: US 6,365,485 B1
(45) Date of Patent: Apr. 2, 2002

(54) DRAM TECHNOLOGY OF BURIED PLATE FORMATION OF BOTTLE-SHAPED DEEP TRENCH

(75) Inventors: Jia. S. Shiao; Wen B. Yen, both of Hsinchu (TW)

(73) Assignees: Promos Tech., Inc,; Mosel Vitelic Inc., Hsinchu, both of (TW); Siemens Ag., Munich (DE)

( * ) Notice: Subject to any disclaimer, the term of this patent is extended or adjusted under 35 U.S.C. 154(b) by 0 days.

(21) Appl. No.: 09/552,028

(22) Filed: Apr. 19, 2000

(51) Int. Cl.[7] .................. H01L 21/20; H01L 21/8242
(52) U.S. Cl. .................. 438/392; 438/386; 438/249
(58) Field of Search .................. 438/381, 386, 438/392, 243, 249

(56) References Cited

U.S. PATENT DOCUMENTS

| | | | | |
|---|---|---|---|---|
| 5,658,816 A | * | 8/1997 | Rajeevakumar | 438/386 |
| 5,885,863 A | * | 3/1999 | Yoshida | 438/239 |
| 6,008,104 A | * | 12/1999 | Schrems | 438/386 |
| 6,204,112 B1 | * | 3/2001 | Chakravarti et al. | 438/243 |

OTHER PUBLICATIONS

Ozaki et al., 0.288 square micron Trench Cell Technologies with Bottle–Shaped Capacitor for 1 Gbit Drams, 1995, IEEE, pp 661–664.*

Zagozdzon–Wosik et al., Doping of Trench Capacitors by Rapid Thermal Diffusion, Jun. 1991, IEEE Electron Device Letters, vol. 12, No. 6, pp 264–266.*

\* cited by examiner

Primary Examiner—Richard Elms
Assistant Examiner—Adam Pyonin
(74) Attorney, Agent, or Firm—W. Wayne Liauh

(57) ABSTRACT

An improved method for forming a buried plate in a bottle-shaped deep trench capacitor. The method includes the steps of: (a) forming a deep trench into a semiconductive substrate; (b) filling the deep trench with a first dielectric material to a first predetermined depth; (c) forming a silicon nitride sidewall spacer in the deep trench above the dielectric layer; (d) removing the first dielectric layer, leaving the portion of the substrate below the sidewall spacer to be exposed; (e) using the sidewall spacer as a mask, causing the exposed portion of the substrate to be oxidized, then removing the oxidized substrate; (f) forming an arsenic-ion-dope conformal layer around the side walls of the deep trench, including the sidewall spacer; (g) heating the substrate to cause the arsenic ions to diffuse into the substrate in the deep trench not covered by the sidewall spacer; and (h) removing the entire arsenic-ion-doped layer. This method(can also be advantageously applied to the fabrication of buried plates for conventional deep trench capacitors.

16 Claims, 7 Drawing Sheets

US 6,365,485 B1

DRAM TECHNOLOGY OF BURIED PLATE FORMATION OF BOTTLE-SHAPED DEEP TRENCH

FIELD OF THE INVENTION

The present invention relates to a novel method for making buried layers as the first part of the process of making sub-micron-sized deep trench capacitors. More specifically, the present invention relates to a novel method for making a buried layer for use as a conductive plate in a deep trench capacitor, wherein the final deep trench capacitor contains a pair of conductive plates separated by a dielectric layer to serve as a storage mode as part of a sub-micron-sized semiconductor device. The method disclosed in the present invention enables the subsequent steps of forming the second conductive plate in the deep trench capacitor to be greatly simplified by eliminating and/or simplifying many of the complicated steps required in the conventional processes, while improving the integrity of the resultant deep trench capacitor and allowing the storage capacity of the deep trench capacitor to remain the same or even enhanced. The method of the present invention is most advantageous for forming buried plates in bottle-shaped deep trench capacitors which have an enlarged diameter, or more generally speaking, with an enlarged circumference or cross-sectional area in the bottom portion thereof. However, the method of the present invention can also be advantageously utilized for forming buried plates for conventional deep trench capacitors.

BACKGROUND OF THE INVENTION

A capacitor comprises a dielectric layer sandwiched by a pair of spaced conducting plates. There are two basic types of capacitors provided in a semiconductor device, for example, dynamic random access memory or DRAM: the crown-type capacitors and the deep-trench type capacitors. As the trend in the fabrication of semiconductor devices is toward ever-increasing density of circuit components that can be tightly packed per unit area, there are great demands to develop technologies that can reduce the surface area to be taken by individual circuit components. As a result, deep trench technologies have been developed which result in structures, particularly large area capacitors, that are vertically oriented with respect to the plane of the substrate surface.

A deep trench capacitor typically comprises a dielectric layer formed on the sidewalls of a deep trench, which is formed into and surrounded by a highly doped buried plate (which constitutes the first conducting plate), and a highly doped poly fill (which constitutes the second conducting plate), which fills the deep trench. The dielectric layer separates the first and the second conducting plates. The capacitance of the deep trench capacitor is determined by the total sidewall surface of the trench, which, in turn, is determined by the diameter, or more specifically the circumference, of the deep trench. As the semiconductor fabricating technology moves into the sub-micron or even deep sub-micron range, it is increasingly recognized that the present technology for making deep trench capacitors may be inadequate. For deep sub-micron semiconductor devices, a deep trench can have a length-to-diameter aspect ratio of 35:1 or even greater. With current technology, the diameter (or width or circumference) of the trench generally decreases with depth. Such a tapered cross-sectional area causes a significant decrease in the overall sidewall surface of the trench, and, consequently, the capacitance provided by the deep trench capacitor. This problem is expected to become even more profound as we move into the next generation of ULSI fabrication technologies that are characterized with critical dimensions of 0.15-micron or even finer.

In the conventional process for making deep trenches, a pad oxide layer 102 and a hard mask 104 are first formed on a substrate, then a deep trench 106 is formed with the aid of the hard mask 104, as shown in FIG. 1A.

FIG. 1B shows that a doped dielectric layer 112 is formed on the side wall of the deep trench 106. The deep trench 106 is then partially filled with a photoresist 1 14 in the lower portion thereof, leaving the doped dielectric layer in the upper portion of the deep trench exposed. The exposed doped dielectric layer is removed by etching, followed by filling the deep trench with a cap oxide, such as cap TEOS. Thereafter, the cap oxide is recessed (etching/deposition/etching) to form an oxide collar 116, causing the photoresist 114 to be exposed. This is shown in FIG. 1C.

After the photoresist 114 is removed, the substrate 100 is subjected to a thermal process to pause the impurities in the doped dielectric layer to diffuse into the substrate to form a doped zone 118. The doped zone, or buried layer, serves as the first conductive plate for the deep trench capacitor. This is shown in FIG. 1D.

The conventional processes involve repeated applications of chemical vapor deposition and recessing (i.e., replacing one oxide layer with another). As described in a co-pending application filed on the same date and the content thereof is incorporated herein by reference, if the conventional technology is applied to form a deep trench capacitor, the resultant bottle-shaped deep trench capacitor typically contains a second conducting plate which is made of three conducting layers. All these three layers can be made of the same material and may look as if the second conducting plate contains only an integrated layer. However, it is important to note that, due to the process steps involved, the second conducting plate typically contains conducting layers that are formed in three separate stages. The second conducting layer is formed after the formation of, in the sequence, the collar oxide and the first conducting layer. The third conducting layer, which is in contact with the semiconductive substrate, is formed after the removal of part of the collar oxide and the etching-off of corresponding part of the second conducting layer. Thus, with the conducting layers alone, the conventional processes involve at least three cycles of deposition and controlled etching. It may be possible to reduce the number of deposition/recessing/etching cycles involved in the formation of the conductive layers, but this may result in other process complexities. Furthermore, the dependence on the collar oxide to perform selected doping may cause a shorting problem in the sub-micron-sized deep trench capacitors.

In order to meet the consumers' demand and expectation of continual lowered price of electronic components, it is necessary to find ways that can significantly simplify the semiconductor fabrication process so as to reduce the manufacturing cost. This is particularly important for the fabrication of some of the most common devices such as DRAM. Equally important is the need to improve the integrity of the product, so as to minimize the failure rate and further improve the overall production cost.

SUMMARY OF THE INVENTION

The primary object of the present invention is to develop an improved process for the manufacturing of bottle-shaped deep trench capacitors which will reduce the fabrication cost while maintaining or even improving product performance and yield rate. More specifically, the primary object of the present invention is to develop an improved process for making buried plates used in the deep trench capacitors which minimizes the number of deposition/recessing/etching cycles required for the manufacturing of bottle-shaped deep trench capacitors without adversely affecting the performance of the resultant product. In fact, the modifications made in the process of the present invention actually improve the integrity of the bottle-shaped deep trench capacitor, resulting in not only cost savings but also increased product yield.

The process disclosed in the present invention is actually a port of an overall novel process for the fabrication of bottle-shaped deep trench capacitors. To ensure a continuity of this disclosure, the overall process for fabricating the bottle-shaped deep trench capacitors is summarized below which includes the following main steps:

(1) Forming a pad oxide layer and a hard mask layer on the surface of a semiconductive substrate;

(2) Using a photolithography process to form a vertically elongated trench (i.e., deep trench) through the oxide and hard mask layers and into the substrate;

(3) Partially filling the deep trench with a first dielectric material to form a first dielectric layer having a first predetermined depth intended for the deep trench capacitor;

(4) Forming a sidewall spacer in the deep trench above the dielectric layer, the sidewall spacer being made from a second dielectric material having a different etchability from the first dielectric material as well as allowing low diffusion rate for ions;

(5) Removing the first dielectric layer;

(6) Using the sidewall space as a mask, causing the exposed portion of the substrate in the deep trench to be oxidized, then removing the oxidized substrate;

(7) Forming an ion-doped conformal layer around the side walls of the deep trench, including the sidewall spacer and extending to the hard mask layer;

(8) Heating the substrate to cause the doping ions to diffuse into the substrate in the deep trench not covered by the sidewall spacer, the diffused region becomes the first conductive plate;

(9) Removing the entire ion-doped conformal layer;

(10) Forming a conformal second dielectric layer covering the surface of the deep trench including the sidewall spacer, then filling the deep trench with a first conductive material to a second predetermined depth which is above the first predetermined depth;

(11) Removing the sidewall spacer and the second dielectric layer above the second predetermined depth; and

(12) Filling the deep trench with a second conductive material.

Specifically, the present invention encompasses Steps(1) through (6) of the overall process, i.e., up to the step where a buried plate, or first conductive plate, is formed. These steps are specifically recited in the present invention because the second conductive plate can be fabricated using other approaches. Also, the presence of the nitride sidewall spacer between the first and second predetermined depths has its own merit in that it improves the insulation between the first and the second conductive plates, regardless of how the second conductive plates are made.

One of the main advantages of the present invention is that it greatly simplifies the subsequent steps for forming the second conductive plate. With the process of the present invention, because the ion-doped layer is formed on the sidewall spacer, there is no need to remove the upper portion of the ion-doped layer prior to performing the diffusion step, which is required in the prior art processes. The steps of filling the first and second conductive materials involve filling the deep trench with an appropriate conductive material then controlledly etching the conductive material to respectively desired depths. Because the neck portion of the deep trench is already protected by the sidewall spacer, there is no need to form an oxide collar in the present invention. Furthermore, since the upper-most conductive layer must be in contact with the semiconductive substrate, the present invention also eliminates the need for forming an intermediate conductive layer defined by the oxide collar, then removing the upper portion of the oxide collar.

Although the method described in the present invention is most advantageous for forming bottle-shaped deep trench capacitors, it can also be advantageously used in forming conventional deep trench capacitors. To apply the method of the present invention to conventional non-bottle-shaped deep trench capacitors, step (6), which causes the bottom portion of the deep trench to be enlarged, can be eliminated.

BRIEF DESCRIPTION OF THE DRAWING

The present invention will be described in detail with reference to the drawing showing the preferred embodiment of the present invention, wherein:

FIG. 1A shows that a pad oxide layer and a hard mask are first formed on a substrate, then a deep trench is formed with the aid of the hard mask.

FIG. 1B shows that an ion-doped dielectric layer is formed on the side wall of the deep trench, which is then partially filled with a photoresist in the lower portion thereof, leaving the ion-doped dielectric layer in the upper portion of the deep trench exposed.

FIG. 1C shows that the exposed ion-doped dielectric layer is removed by etching, followed by filling the deep trench with a cap oxide, which is then is recessed to form an oxide collar, causing the photoresist to be exposed.

FIG. 1D shows that, after the photoresist is removed, the substrate is subjected to a thermal process to cause the impurities in the doped dielectric layer to diffuse into the substrate to form a doped zone, which is often called a buried layer and serves as one of the two spaced apart conductive plates for a deep trench capacitor.

FIG. 2A is an illustrative schematic diagram showing that a deep trench is formed into a semiconductive substrate.

FIG. 2B is an illustrative schematic diagram showing that the deep trench is filled with a first dielectric material to a first predetermined depth intended for a deep trench capacitor.

FIG. 2C is an illustrative schematic diagram showing that a sidewall spacer is formed in the deep trench above the first predetermined depth.

FIG. 2D is an illustrative schematic diagram showing that after the removal the first dielectric layer, the exposed portion of the substrate in the deep trench is oxidized, using the sidewall space as a mask, to a predetermined distance into the substrate.

FIG. 2E is an illustrative schematic diagram showing that a bottle-shaped deep trench is formed after the removal oxidized substrate formed in the step shown in FIG. 2D.

FIG. 2F is an illustrative schematic diagram showing that a conformal heavily ion-doped layer is formed which covers the surface of the deep trench including the sidewall spacer.

FIG. 2G is an illustrative schematic diagram showing that the doping ions in the ion-doped layer are caused to diffuse into the substrate except for those areas that are covered by the sidewall spacer, followed by the removal of the ion-doped layer.

FIG. 2H is an illustrative schematic diagram showing that after the formation of a conformal second dielectric layer which covers the surface of the deep trench including the sidewall spacer, the deep trench is filled with a first conductive material above the top surface of the hard mask covering the substrate.

FIG. 2I is an illustrative schematic diagram showing that the first conductive material is controlledly etched to a second predetermined depth which is above the first predetermined depth.

FIG. 2J is an illustrative schematic diagram showing that after the removal of the second dielectric layer above the second predetermined depth, the deep trench is filled with a second conductive material.

DETAILED DESCRIPTION OF THE PREFERRED EMBODIMENT

Figure 1A:
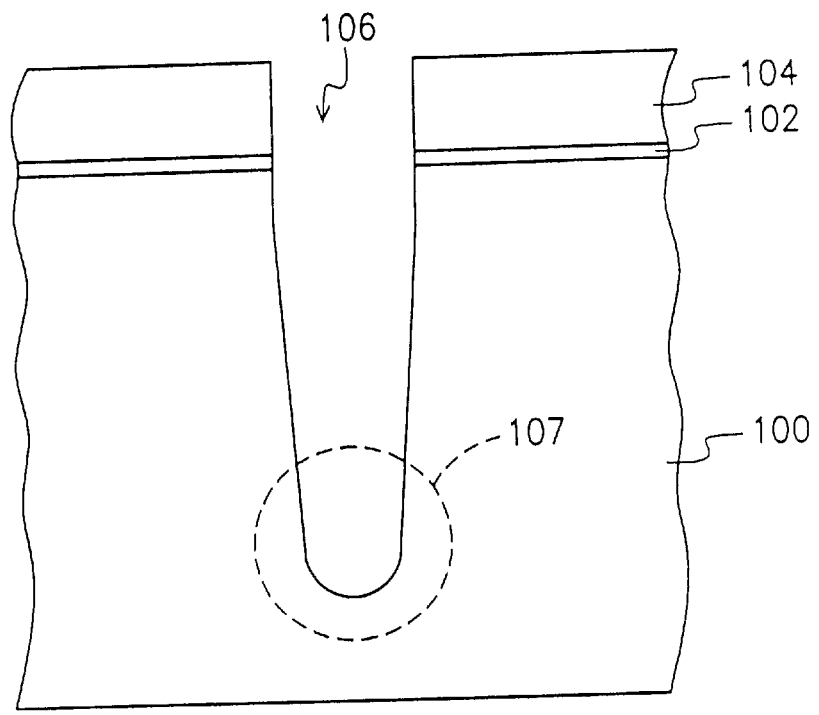
FIGS. 1A–1D are illustrative schematic diagrams showing the main steps of a prior art process for forming a buried plate in a conventional deep trench capacitor.
Figure 1B:
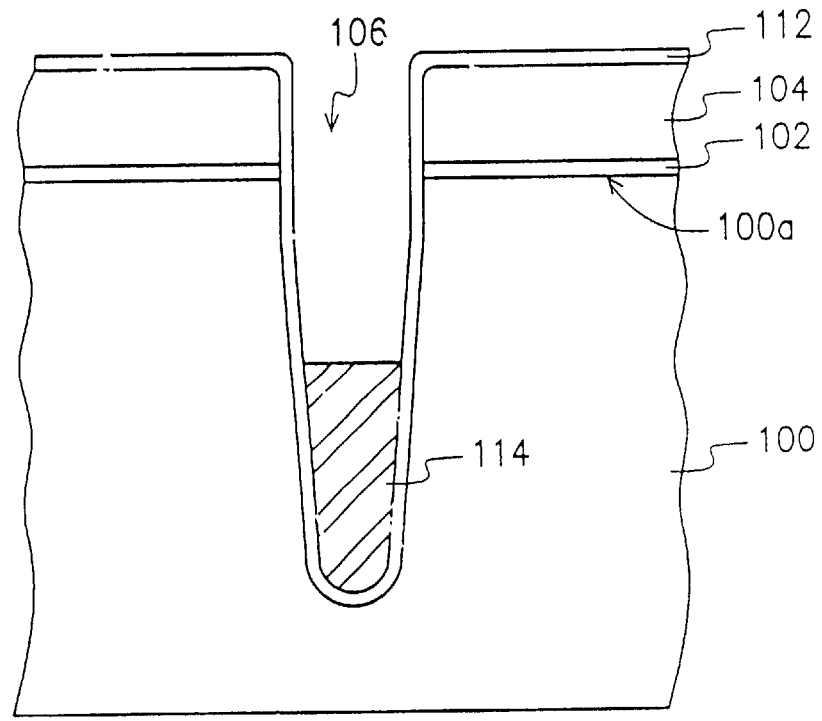
Figure 1C:
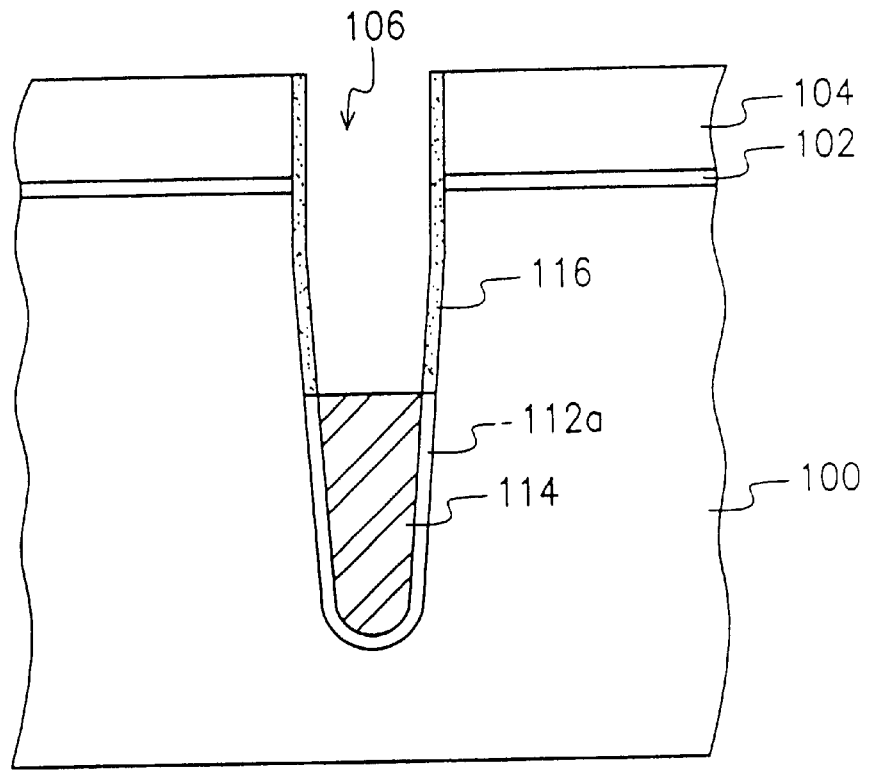
Figure 1D:
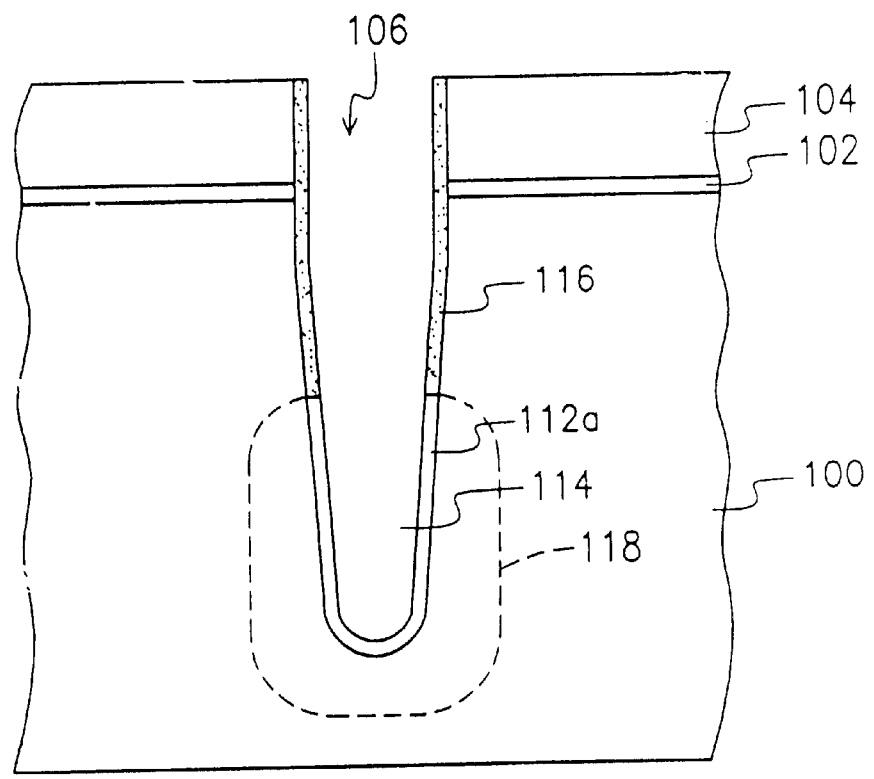

The present invention discloses an improved process which is part of an overall process for the manufacturing of bottle-shaped deep trench capacitors which simplifies the fabrication steps and thus allowing the fabrication cost to be substantially reduced while maintaining or even improving the product quality and yield rate. The present invention specially discloses the steps for forming buried plates, which serve as first conductive plates, inside the deep trench. An important difference between the process of the present invention and that in the prior art processes is that, in the prior art process to make deep trench capacitors, an oxide collar is required after the removal of the dielectric layer above the bottom portion, so as to allow the buried layer to be formed in the bottom portion of the deep trench by diffusion.

In the present invention, in comparison, the dielectric layer is formed on top of the sidewall spacer. Not only that the present invention eliminates many arduous steps in the prior art processes, it also enhances the insulation between the first and second conductive plates, thus, improving the product quality. The fabrication process disclosed in the present invention also reduces the number of subsequent deposition/recessing/etching cycles required for the manufacturing of bottle-shape deep trench capacitors without adversely affecting the performance of the resultant product. The modifications made in the process of the present invention actually improve the integrity of the bottle-shaped deep trench capacitor, resulting in not only cost savings but also increased product yield.

The process disclosed in the present invention for the fabrication of a buried layer inside a bottle-shaped deep trench capacitor includes the following main steps:

(1) Forming a pad oxide layer and a hard mask layer on the surface of a semiconducting substrate. Preferably, the pad oxide layer has a thickness of about 50 Å, and the hard mask layer, which can be made of silicon nitride or a mixture of silicon nitride/oxide using a chemical vapor deposition method, has a thickness of 2,000 Å.

(2) Using a photolithography process in conjunction with a photoresist to form a vertically elongated trench (i.e., deep trench) through the oxide and hard mask layers and into the substrate.

(3) Partially filling the deep trench with a first dielectric material to form a first dielectric layer having a first predetermined depth intended for the deep trench capacitor. Preferably, this step is achieved by first filling the deep trench with the first dielectric material, then etching the first dielectric material to the first predetermined depth.

(4) Forming a sidewall spacer in the deep trench above the dielectric layer, the sidewall spacer being made from a second dielectric material having a different etchability from the first dielectric material as well as allowing low diffusion rate for ions. The sidewall spacer can be formed by a conformal deposition of a hard dielectric material such as silicon nitride followed by anisotropic etching to a thickness of about 200 Å.

(5) Removing the first dielectric layer by a selective etching technique which does not affect the sidewall spacer. This will leave the bottom portion of the deep trench, i.e., the portion intended to be enlarged, to be exposed.

(6) Using the sidewall space as a mask, causing the exposed portion of the substrate in the deep trench to be oxidized by, for example, an RTP process under an oxygen environment. The oxidized substrate, i.e., silicon oxide, can be removed by wet etching. This causes the bottom portion of the deep trench to be enlarged.

(7) Using a combined in-situ ion-doping and chemical vapor deposition technique to form an ion-doped conformal layer around the side walls of the deep trench, including the sidewall spacer and extending to the hard mask layer. Preferably the doping ions are arsenic ions.

(8) Heating the substrate to cause the doping ions to diffuse into the substrate in the deep trench not covered by the sidewall spacer, the diffused region becomes the first conductive plate. One of the main differences between the present invention and the prior processes is that the method of the present invention does not have to remove the upper portion of the ion-doped layer before the diffusion step. This allows the elimination of a significant step in the fabrication of bottle-shaped deep trench capacitors.

After the first conductive plate, or the buried plate, is formed, the process can continue to include the following steps to complete the formation of a bottle-shaped deep trench:

(1') Removing the entire ion-doped layer using BHF (buffered hydrofluoric acid) or DHF (diluted hydrofluoric acid). Because the diffused layer is pushed away from the original trench surface, it results in about 50% to 100% increase in the surface of the deep trench capacitor.

(2') Forming a conformal second dielectric layer which covers the surface of the deep trench including the sidewall spacer. The second dielectric layer provides the insulation between the first conductive plate, which is the diffused zone, and the second conductive plate to be formed subsequently. This step is followed by filling the deep trench with a first conductive material and controlledly etching first conductive material to a second predetermined depth which is above the first predetermined depth. During the controlled etching step, since the neck portion is already covered by the hard sidewall spacer, there is no need to form an oxide collar. The present invention also eliminates the need to form an intermediate conductive layer between the first and second predetermined depths.

(3') Removing the sidewall spacer and the second dielectric layer above the second predetermined depth by selective etching which does not affect the conductive material.

(4') Filling the deep trench with a second conductive material. Excess amount of the second conductive material can be removed by chemical-mechanical polishing (CMP). As discussed before, because the hard sidewall is present behind the second dielectric layer, The present invention also eliminates the need to form an intermediate conductive layer between the first and second predetermined depths, as required in prior art processes.

The steps of forming the buried plates are separately addressed in the present invention, because other alternatives can be utilized to form the second conductive plates. On the other hand, the method of the present invention allows a substantially improved insulation to be achieved between the first and second conductive plates, regardless of how the second conductive plates are made.

The process disclosed in the present invention can also be applied to the fabrication of buried plates for conventional deep trenches. It then includes the following main steps:

(1) Forming a pad oxide layer and a hard mask layer on the surface of a semiconducting substrate.

(2) Using a photolithography process in conjunction with a photoresist to form a vertically elongated trench (i.e., deep trench) through the oxide and hard mask layers and into the substrate.

(3) Partially filling the deep trench with a first dielectric material to form a first dielectric layer having a first predetermined depth intended for the deep trench capacitor.

(4) Forming a sidewall spacer in the deep trench above the dielectric layer, the sidewall spacer being made from a second dielectric material having a different etchability from the first dielectric material as well as allowing low diffusion rate for ions. The sidewall spacer can be formed by a conformal deposition of a hard dielectric material such as silicon nitride followed by anisotropic etching to a thickness of about 200 Å.

(5) Removing the first dielectric layer by a selective etching technique which does not affect the sidewall spacer. This will leave the bottom portion of the deep trench, i.e., the portion intended to be enlarged, to be exposed.

(6) Using a combined in-situ ion-doping and chemical vapor deposition technique to form an ion-doped conformal layer around the side walls of the deep trench, including the sidewall spacer and extending to the hard mask layer.

(7) Heating the substrate to cause the doping ions to diffuse into the substrate in the deep trench not covered by the sidewall spacer, the diffused region becomes the first conductive plate. Again, one of the main differences between the present invention and the prior processes is that the method of the present invention does not have to remove the upper portion of the ion-doped layer before the diffusion step. This allows the elimination of a significant step in the fabrication of bottle-shaped deep trench capacitors.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 2A–2G illustrate an example of the main steps for forming a buried plate in a bottleshaped deep trench capacitor according to a preferred embodiment of the present invention. Each of these steps is described in more detail below.

Figure 2A:
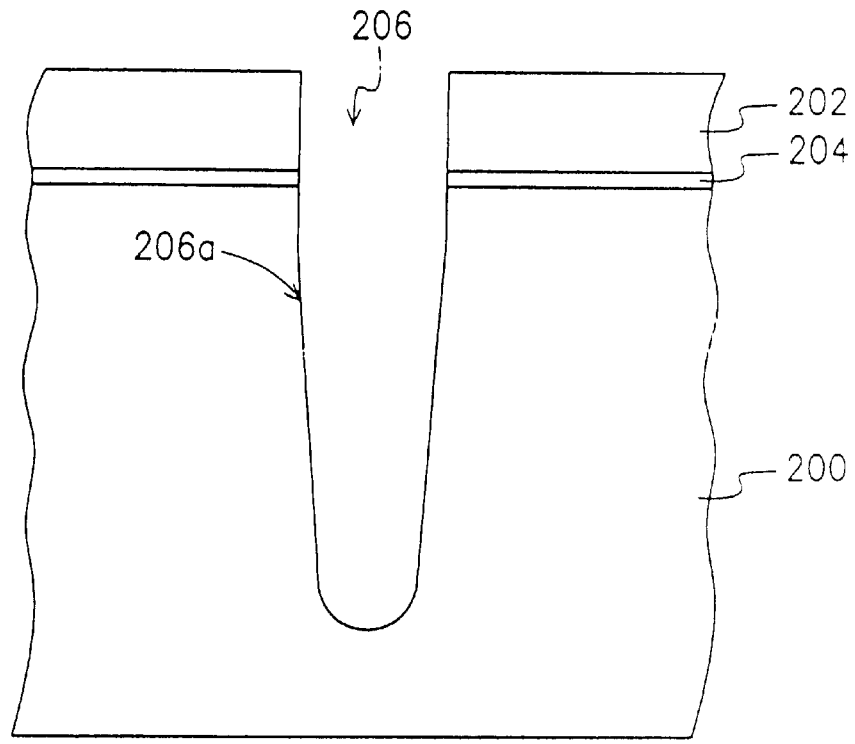
FIGS. 2A–2J are illustrative schematic diagrams showing the main steps, according to a preferred embodiment, of forming a bottle-shaped deep trench capacitor incorporating a preferred embodiment of the present invention, wherein the present invention deals with the steps of forming a buried plate in the bottom portion of the deep trench, as illustrated in FIGS. 2A–2G.

FIG. 2A shows that a deep trench 206 is formed, using a photolithography process, into a semiconductive substrate 200 with an exposed surface 206a in the deep trench. The length-to-width ration is about 35. Prior to the formation of the deep trench 206, a pad oxide layer 204 and a hard mask layer 202 were formed on the surface of the semiconducting substrate. The pad oxide layer has a thickness of about 50 Å, and the hard mask layer, which can be made of silicon nitride or a mixture of silicon nitride/oxide using a chemical vapor deposition method, has a thickness of 2,000 Å.

Figure 2J:
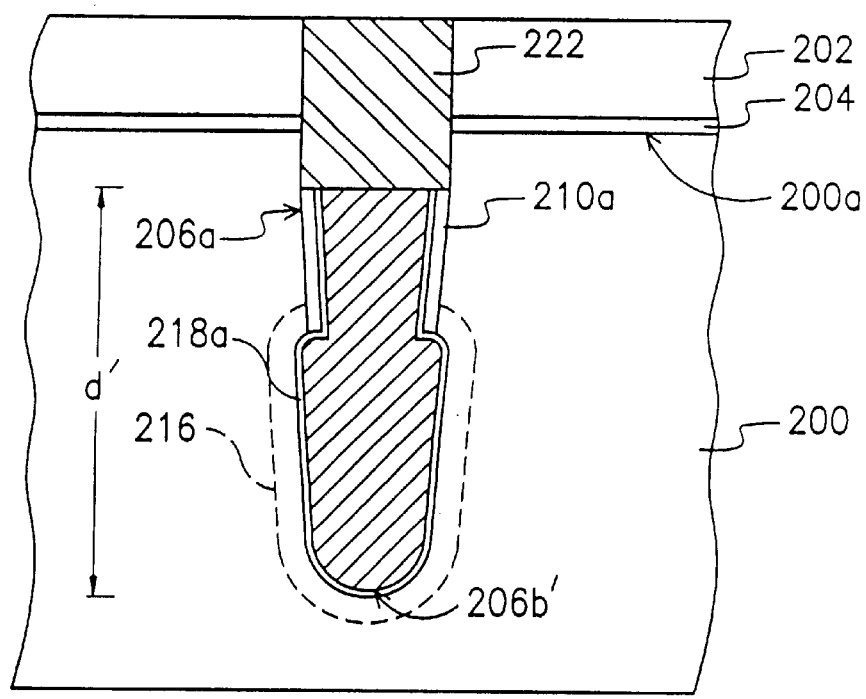
Figure 2B:
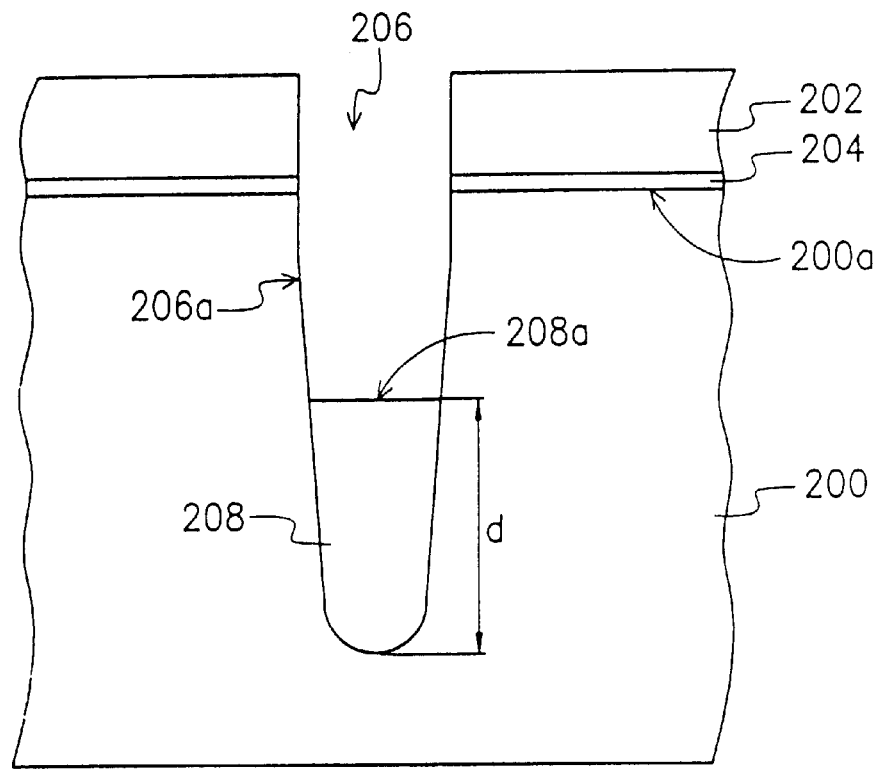

FIG. 2B shows that the deep trench is filled with a first dielectric material 208 to a first predetermined depth "d" intended for a deep trench capacitor. This step is achieved by first filling the deep trench with the first dielectric material, then controlledly etching the first dielectric material to the first predetermined depth.

Figure 2C:
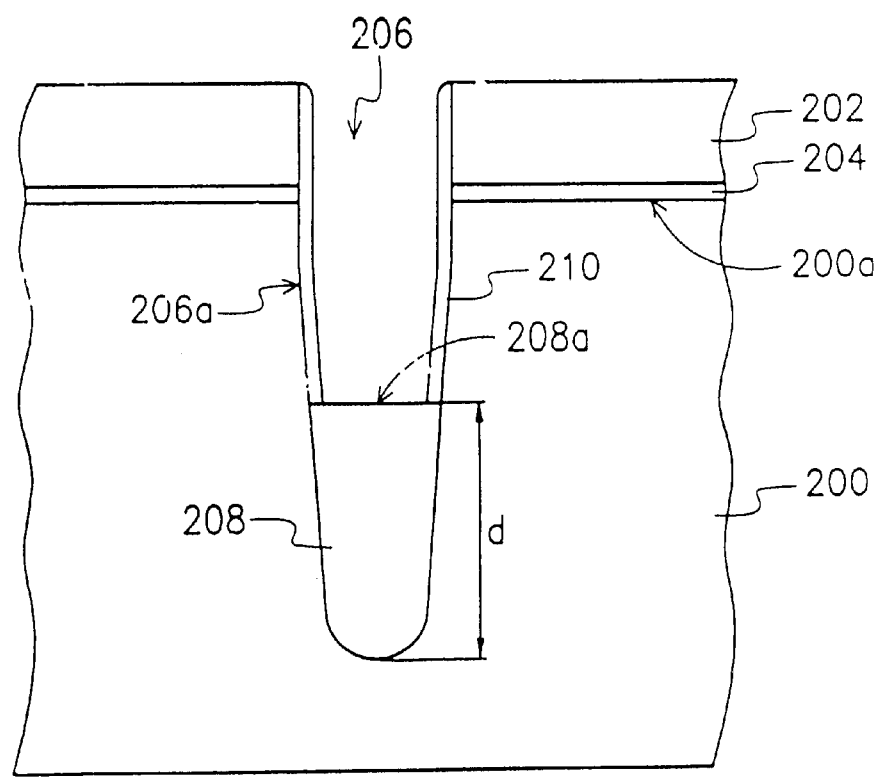

FIG. 2C shows that a sidewall spacer 210 is formed in the deep trench above the surface 208a of the first dielectric material 208. The sidewall spacer is formed by a conformal deposition of a hard silicon nitride followed by anisotropic etching to a thickness of about 200 Å.

Figure 2D:
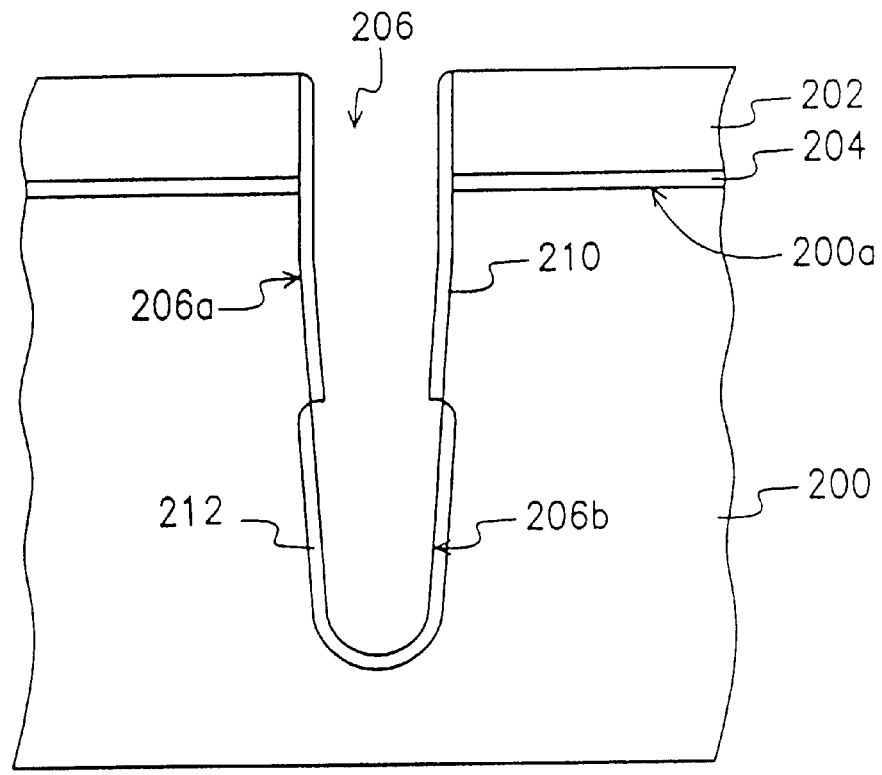
Figure 2E:
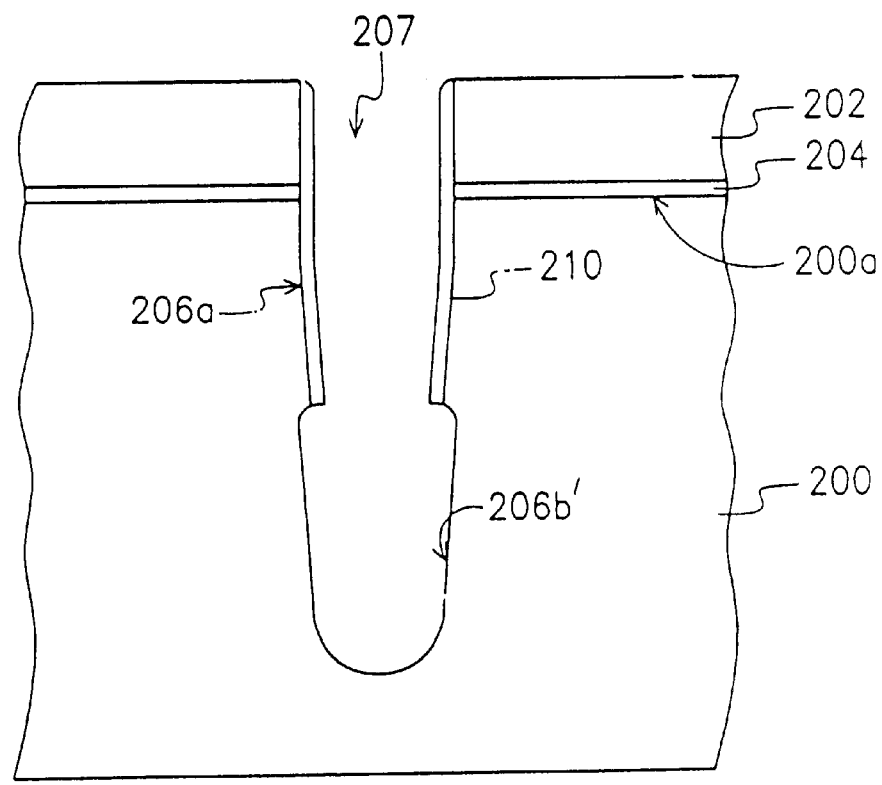

FIG. 2D shows that after the removal the first dielectric layer, the exposed portion 206b of the substrate in the deep trench is oxidized, using the sidewall spacer 210 as a mask, to a predetermined distance into the substrate 200. This is done by first removing the first dielectric layer by a selective etching method which does not affect the sidewall spacer. This leaves the bottom portion 206b of the deep trench, i.e., the portion intended to be enlarged, to be exposed. Then utilizing the sidewall space as a mask, the exposed portion of the substrate in the deep trench is oxidized using an RTP process under an oxygen environment. The oxidized substrate 212, i.e., silicon oxide, is then removed by wet etching, thereby causing the bottom portion of the deep trench to be enlarged, as shown in FIG. 2E.

Figure 2F:
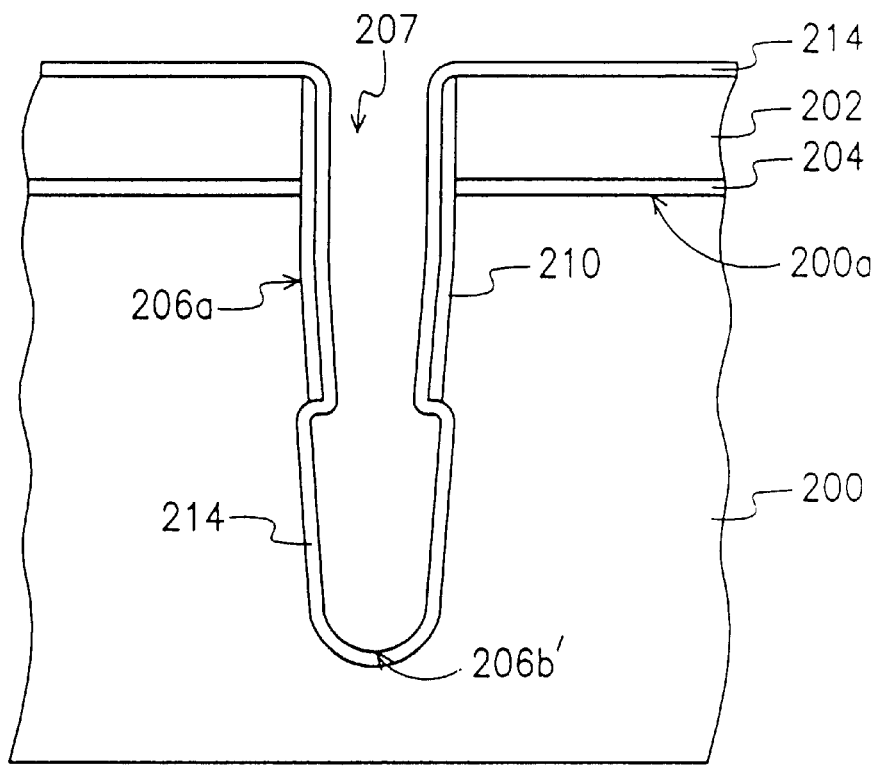
Figure 2G:
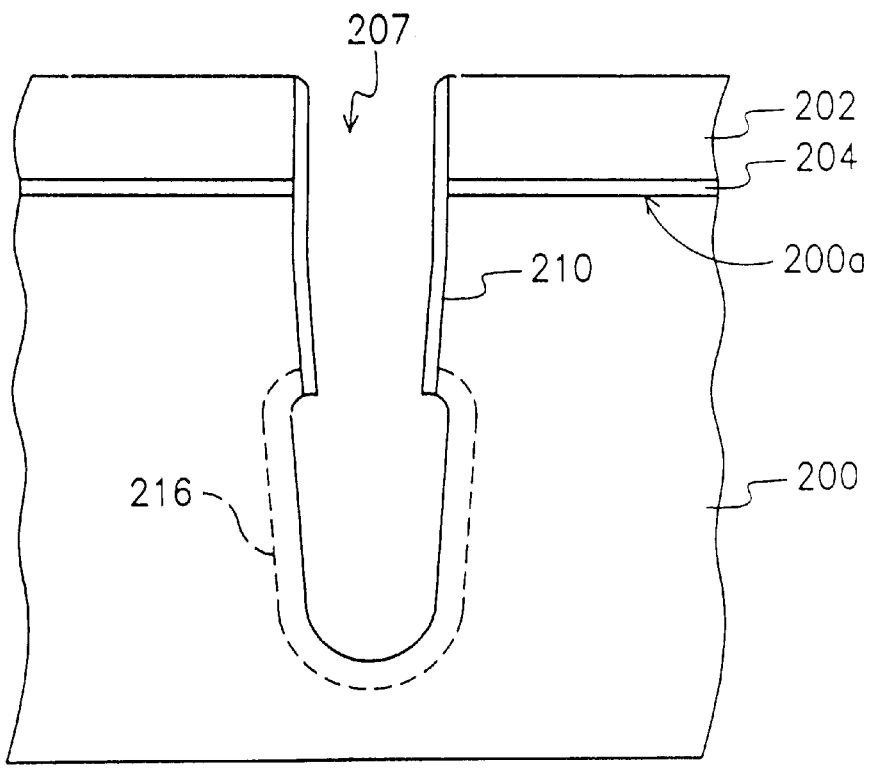

FIG. 2F shows that a conformal heavily arsenic-ion-doped layer 214 is formed which covers the surface of the deep trench including the sidewall spacer, 210 using a combined in-situ ion-doping and chemical vapor deposition technique. The substrate is heated causing the arsenic ions to diffuse into the substrate in the deep trench not covered by the sidewall spacer, the diffused region becomes the first conductive plate 216, as shown in FIG. 2G. FIGS. 2F and 2G show that the top or neck portion 207 of the deep trench is protected by the hard sidewall spacer 210. After diffusion, the entire ion-doped layer is removed using BHF (buffered hydrofluoric acid) or DHF (diluted hydrofluoric acid) etching. Because the diffused layer is pushed away from the original trench surface, it results in about 50% to 100% increase in the surface of the deep trench capacitor.

EXAMPLE 1'

Figure 2H:
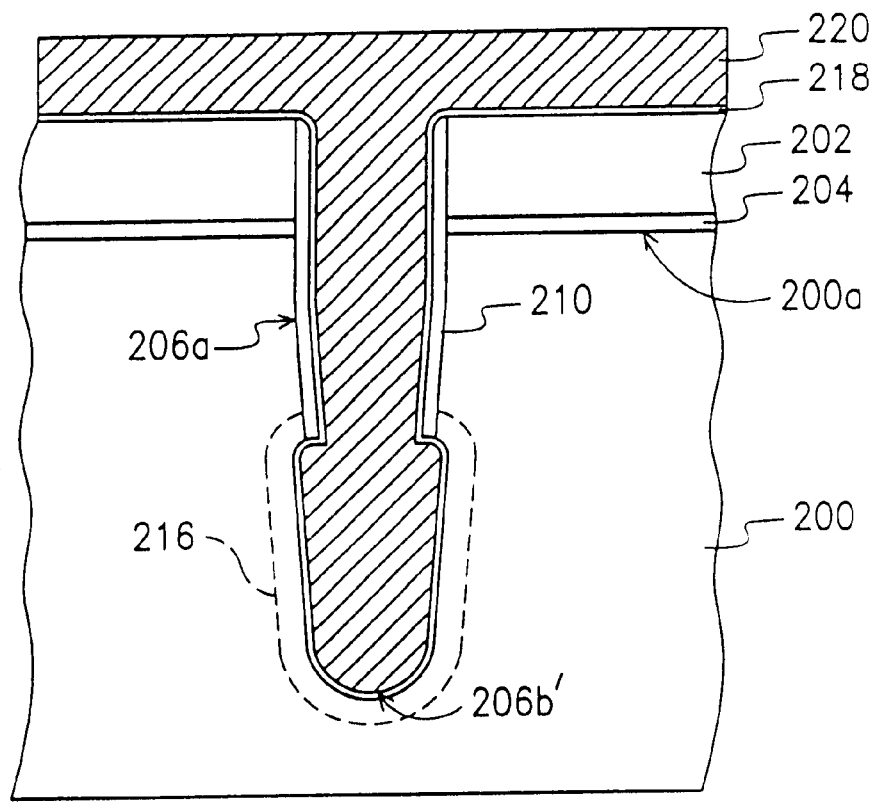
Figure 2I:
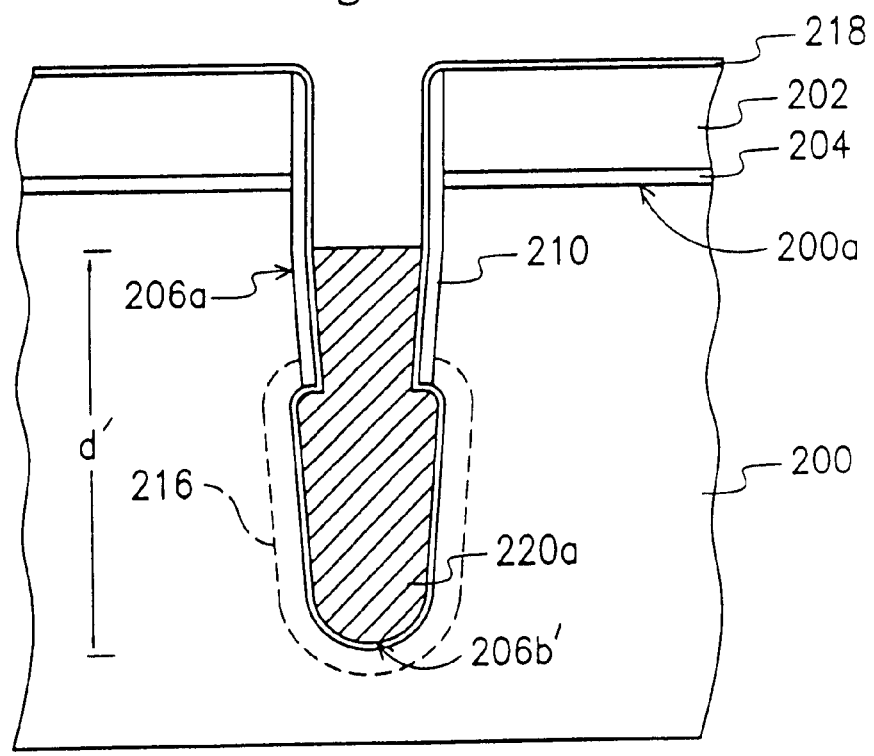

FIGS. 2H–2J illustrate an example of the main steps for forming the second conductive plate in a bottle-shaped deep trench capacitor, after the a buried plate is formed in Example 1. Each of these steps is described in more detail below.

FIG. 2H shows that after the formation of a conformal second dielectric layer 218 which covers the surface of the deep trench including the sidewall spacer, the deep trench is filled with a first conductive material 220 covering the substrate as well as the hard mask 202. Thereafter, the first conductive material 220a is etched off to a second predetermined depth d' which is above the first predetermined depth d, as shown in FIG. 2I.

FIG. 2J shows that, after the removal of the second dielectric layer above the second predetermined depth, the deep trench is filled with a second conductive material 222. This is achieved by first filling the deep trench with a second conductive material. Excess amount of the second conductive material is removed by chemical-mechanical polishing (CMP) so as to be flat with the hard mask 202. The second conductive material 222 is in contact with the substrate 200. FIG. 2J also shows that the first conductive plate 216 is insulated from the second conductive plate by the remaining portion of the conformal second dielectric layer 218a and the remaining portion of the sidewall spacer. The nitride sidewall spacer between the second predetermined depth d' and the first predetermined depth d provides additional insulation between the first and second conductive plates.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a buried plate in a bottle-shaped deep trench capacitor, said method comprising the steps of:
   (a) forming a deep trench with a side wall into a semiconductive substrate;
   (b) filling said deep trench with a first dielectric material to form a first dielectric layer having a first depth below a top of said deep trench;
   (c) forming a sidewall spacer in said deep trench above said dielectric layer, said sidewall spacer being made from using silicon nitride which has a slower etching rate than said first dielectric material;
   (d) removing said first dielectric layer to allow said substrate in a lower portion of said deep trench below said sidewall spacer to be exposed;
   (e) using said sidewall spacer as a mask, causing said exposed portion of said substrate in said deep trench to be oxidized, then removing said oxidized substrate to enlarge the diameter of said lower portion of said deep trench;
   (f) forming an ion-doped conformal layer containing doping ions to cover the entire side wall of said deep trench, including said sidewall spacer, said doping ions having a low diffusion rate in said sidewall spacer; and
   (g) heating said substrate to cause said doping ions to diffuse into said substrate in said deep trench not covered by said sidewall spacer, wherein said diffused region becomes said first conductive plate.

2. The method for forming a buried plate in a bottle-shaped deep trench capacitor according to claim 1 which further comprises the step of forming a pad oxide layer on said semiconductive substrate and a hard mask layer on said pad oxide prior to forming said deep trench.

3. The method for forming a buried plate in a bottle-shaped deep trench capacitor according to claim 1 wherein said step (b) of partially filling said deep trench with a first dielectric material is achieved by filling said deep trench with said first dielectric material, then etching said dielectric material to said first predetermined depth.

4. The method for forming a buried plate in a bottle-shaped deep trench capacitor according to claim 1 wherein said sidewall spacer comprises silicon nitride.

5. The method for forming a buried plate in a bottle-shaped deep trench capacitor according to claim 1 wherein said sidewall spacer is formed by depositing a conformal dielectric layer on the side wall surface of said deep trench, followed by anisotropic etching.

6. The method for forming a buried plate in a bottle-shaped deep trench capacitor according to claim 1 wherein said ion-doped layer contains arsenic ions.

7. The method for forming a buried plate in a bottle-shaped deep trench capacitor according to claim 1 wherein said oxidized substrate in step (e) has a thickness of about 500 to 1,000 Å.

8. The method for forming a buried plate in a bottle-shaped deep trench capacitor according to claim 1 which further comprises the step of removing the entire said ion-doped layer using buffered hydrofluoric acid or diluted hydrofluoric acid.

9. A method for forming a buried plate for a deep trench capacitor, said method comprising the steps of:
   (a) forming a deep trench with a side wall into a semiconductive substrate;
   (b) filling said deep trench with a first dielectric material to form a first dielectric layer having a first depth;
   (c) forming a sidewall spacer in said deep trench above said dielectric layer, said sidewall spacer being made from using silicon nitride which has a slower etching rate than said first dielectric material;
   (d) removing said first dielectric layer to allow said substrate in a lower portion of said deep trench below said sidewall spacer to be exposed;
   (e) forming an ion-doped conformal layer containing doping ions to cover the entire side wall of said deep trench, including said sidewall spacer, said doping ions having a low diffusion rate in said sidewall spacer; and
   (f) heating said substrate to cause said doping ions to diffuse into said substrate in said deep trench not covered by said sidewall spacer, wherein said diffused region becomes said first conductive plate.

10. The method for forming a buried plate in a bottle-shaped deep trench capacitor according to claim 9 which further comprises the steps of forming a pad oxide layer on said semiconductive substrate and then forming a hard mask layer on said pad oxide prior to forming said deep trench.

11. The method for forming a buried plate in a deep trench capacitor according to claim 9 wherein said step (b) of partially filling said deep trench with a first dielectric material is achieved by filling said deep trench with said first dielectric material, then etching said dielectric material to said first predetermined depth.

12. The method for forming a buried plate in a deep trench capacitor according to claim 9 wherein said sidewall spacer comprises silicon nitride.

13. The method for forming a buried plate in a deep trench capacitor according to claim 9 wherein said sidewall spacer is formed by depositing a conformal dielectric layer on the side wall surface of said deep trench, followed by anisotropic etching.

14. The method for forming a buried plate in a deep trench capacitor according to claim 9 wherein said ion-doped layer contains arsenic ions.

15. The method for forming a buried plate in a deep trench capacitor according to claim 9 wherein said oxidized substrate in step (e) has a thickness of about 500 to 1,000 Å.

16. The method for forming a buried plate in a bottle-shaped deep trench capacitor according to claim 9 which further comprises the step of removing the entire said ion-doped layer using buffered hydrofluoric acid or diluted hydrofluoric acid.

* * * * *